United States Patent

Yoda

(10) Patent No.: US 7,123,309 B2
(45) Date of Patent: Oct. 17, 2006

(54) TELEVISION TUNER SUITABLE FOR DEMODULATION OF BOTH ANALOG SIGNALS AND DIGITAL SIGNALS

(75) Inventor: Mitsumasa Yoda, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 576 days.

(21) Appl. No.: 10/614,544

(22) Filed: Jul. 7, 2003

(65) Prior Publication Data
US 2004/0105035 A1 Jun. 3, 2004

(30) Foreign Application Priority Data
Jul. 9, 2002 (JP) ............... 2002-199380

(51) Int. Cl.
H04N 5/46 (2006.01)
(52) U.S. Cl. .................................. 348/731
(58) Field of Classification Search ............... 348/731, 348/725, 726, 732, 607, 614; 455/188.1
See application file for complete search history.

(56) References Cited

U.S. PATENT DOCUMENTS

| 5,574,997 | A * | 11/1996 | Hong | 455/180.1 |
|---|---|---|---|---|
| 5,805,241 | A * | 9/1998 | Limberg | 348/725 |
| 6,016,170 | A * | 1/2000 | Takayama et al. | 348/731 |
| 6,353,463 | B1 * | 3/2002 | Seo | 348/731 |
| 6,400,419 | B1 * | 6/2002 | Yamamoto | 348/731 |
| 6,535,722 | B1 * | 3/2003 | Rosen et al. | 455/188.2 |
| 6,678,013 | B1 * | 1/2004 | Ogasawara | 348/731 |
| 6,721,017 | B1 * | 4/2004 | Yamamoto | 348/729 |
| 6,876,402 | B1 * | 4/2005 | Sasaki | 348/731 |
| 6,917,390 | B1 * | 7/2005 | Sasaki | 348/731 |
| 2005/0162570 | A1 * | 7/2005 | Hall et al. | 348/735 |

FOREIGN PATENT DOCUMENTS

| EP | 0 903 937 A | 3/1999 |
|---|---|---|
| EP | 1 061 736 A | 12/2000 |
| EP | 1061736 A1 * | 12/2000 |
| JP | 2000-350107 | 12/2000 |

* cited by examiner

Primary Examiner—Paulos M. Natnael
(74) Attorney, Agent, or Firm—Brinks Hofer Gilson & Lione

(57) ABSTRACT

There are provided a mixer for subjecting entered digital television signals or analog television signals to frequency conversion into an intermediate frequency band and an intermediate frequency tuning circuit so configured as to enable tuning frequency to be switched in the intermediate frequency band and provided at a stage immediately following the mixer, and the intermediate frequency tuning circuit is tuned to a first frequency substantially at a center of the intermediate frequency band when digital television signals are entered into the mixer or to a second frequency, which is higher than the first frequency when analog television signals are entered.

3 Claims, 2 Drawing Sheets

TELEVISION TUNER SUITABLE FOR DEMODULATION OF BOTH ANALOG SIGNALS AND DIGITAL SIGNALS

BACKGROUND OF THE INVENTION

1. Field of the Invention

The present invention relates to a television tuner capable of selectively receiving digital television signals or analog television signals.

2. Description of the Prior Art

The configuration of a television tuner according to the prior art is shown in FIG. 4. Digital television signals and analog television signals are entered into an input tuning circuit 31. The digital television signals are arrayed in other channels than those in which conventional analog television signals are arrayed, i.e. so-called vacant channels. Some sequences of television signals roughly selected by the input tuning circuit 31, after being amplified by a high frequency amplifier 32, are entered into an inter-stage tuning circuit 33. The tuning frequency of the inter-stage tuning circuit 33 and the tuning frequency of the input tuning circuit 31 are interlocked with each other. In this process, television signals on adjoining channels are further eliminated, and the selected sequence of television signals is entered into a mixer 34.

Local oscillation signals are supplied to the mixer 34 from an oscillator 35. Data for channel selection are entered into a PLL circuit 36 for controlling the oscillation frequency of the oscillator 35 and the tuning frequencies of the input tuning circuit 31 and the inter-stage tuning circuit 33. Into the mixer 34 are entered either digital television signals or analog television signals. Into the PLL circuit 36 is incorporated a switching circuit for supplying a switching signal for distinguishing between specific channels, for instance, a channel for digital television signals and a channel for analog television signals.

In the mixer 34, the entered television signals undergo frequency conversion into an intermediate frequency band (41 MHz to 47 MHz according to the U.S. specification). Therefore the converted signals (intermediate frequency signals) include those deriving from digital television signals and those deriving from analog television signals. The intermediate frequency signals are entered into an intermediate frequency amplifier 38 via an intermediate frequency tuning circuit 37. The intermediate frequency tuning circuit 37 is configured of a parallel tuning circuit, whose tuning frequency is higher than the center of the intermediate frequency band and substantially close to the video intermediate frequency (45.75 MHz according to the U.S. specification).

On the output side of the intermediate frequency amplifying circuit 38 are provided switching means 39 and two intermediate frequency circuits 40 and 41. One of the latter, the intermediate frequency circuit 40 for digital signals, processes digital television signals, while the other, the intermediate frequency circuit 41 for analog signals, processes analog television signals. The switching means 39 connects the intermediate frequency amplifier 38 to one of the intermediate frequency circuit 40 for digital signals and the intermediate frequency circuit 41 for analog signals according to a switching signal supplied from the PLL circuit 36.

Therefore, if digital television signals are entered into the mixer 34, those intermediate frequency signals are entered into the intermediate frequency circuit 40 for digital signals or, if analog television signals are entered, those intermediate frequency signals are entered into the intermediate frequency circuit 41 for analog signals.

In the configuration described above, the intermediate frequency tuning circuit is tuned to the vicinity of the video intermediate frequency. Therefore, it is convenient for the reception of analog television signals because, in video detection of analog television signals, the level of audio intermediate frequency signals should be lower than that of video intermediate frequency signals. However, in digital television signals, there are neither video intermediate frequency signals nor audio intermediate frequency signals, video signals and audio signals are superposed on each other in many carriers within the band, and accordingly it is desirable for the level deviation of the intermediate frequency band to be small. For this reason, with the aforementioned characteristic having a peak in the video intermediate frequency, the level deviation in the band is great, making it impossible for digital television signals to be correctly demodulated.

Conversely, if the intermediate frequency tuning circuit is tuned substantially to the center frequency to reduce the level deviation in the intermediate frequency band, it will be convenient for demodulating digital television signals, but the video intermediate frequency and the audio intermediate frequency being at substantially the same level would be inconvenient for demodulating analog television signals.

SUMMARY OF THE INVENTION

An object of the present invention to provide the intermediate frequency tuning circuit with characteristics suitable for demodulation of both digital television signals and analog television signals.

In order to achieve the object stated above, a television tuner according to the invention is provided with a mixer for subjecting entered digital television signals or analog television signals to frequency conversion into an intermediate frequency band and an intermediate frequency tuning circuit so configured as to enable a tuning frequency to be switched within the intermediate frequency band and arranged at a stage immediately following the mixer, wherein the intermediate frequency tuning circuit is tuned to a first frequency substantially at a center of the intermediate frequency band when the digital television signals are entered into the mixer or tuned to a second frequency higher than the first frequency when the analog television signals are entered into the mixer.

In the television tuner, Q of the intermediate frequency tuning circuit is lowered when the digital television signals are entered into the mixer, and the Q is raised and the tuning frequency is tuned substantially to a video intermediate frequency in the intermediate frequency band when the analog television signals are entered into the mixer.

In the television tuner, the intermediate frequency tuning circuit has a parallel tuning circuit to be substantially tuned to the video intermediate frequency, a series circuit including a switch diode and capacitance elements, and a resistor connected in parallel to the capacitance elements, wherein the series circuit is connected to the parallel tuning circuit in parallel, and the switch diode is turned on when the digital television signals are entered into the mixer or the switch diode is turned off when the analog television signals are entered into the mixer.

The television tuner has switching means provided at a stage following the intermediate frequency tuning circuit and an intermediate frequency circuit for digital signals and an intermediate frequency circuit for analog signals provided in parallel at a stage following the switching means, and the digital television signals having undergone frequency conversion into the intermediate frequency band by the switching means are entered into the intermediate frequency circuit for digital signals or the analog television signals having undergone frequency conversion into the intermediate frequency band are entered into the intermediate frequency circuit for analog signals.

In the television tuner, switching signals to distinguish whether television signals entered into the mixer are the digital television signals or the analog television signals are applied to the switch diode and the switching means.

DETAILED DESCRIPTION OF THE PREFERRED EMBODIMENT

Figure 1:
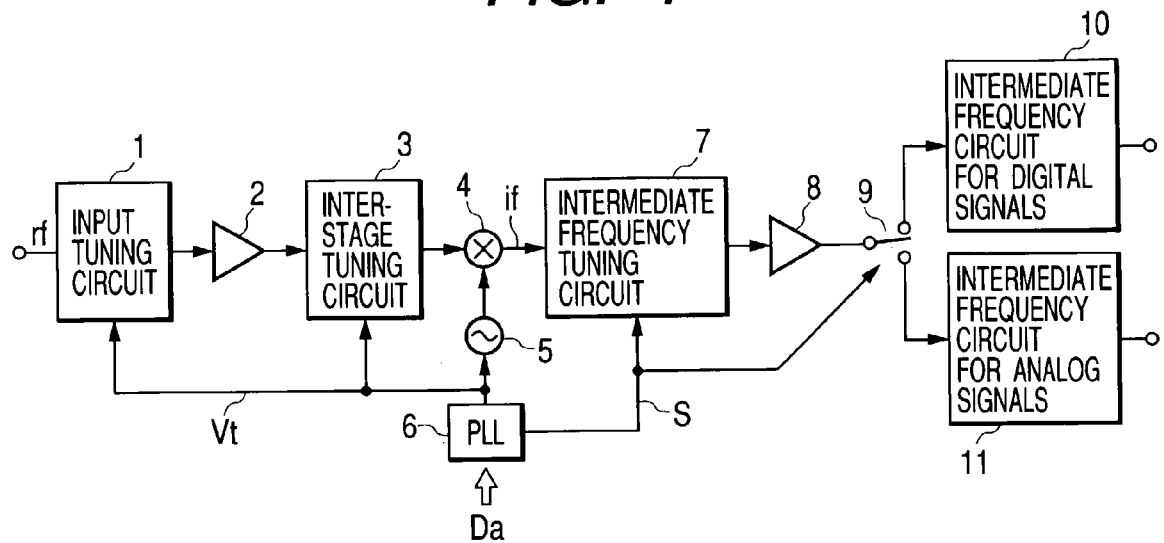
FIG. 1 is a circuit diagram showing the configuration of a television tuner according to the present invention.
Figure 2:
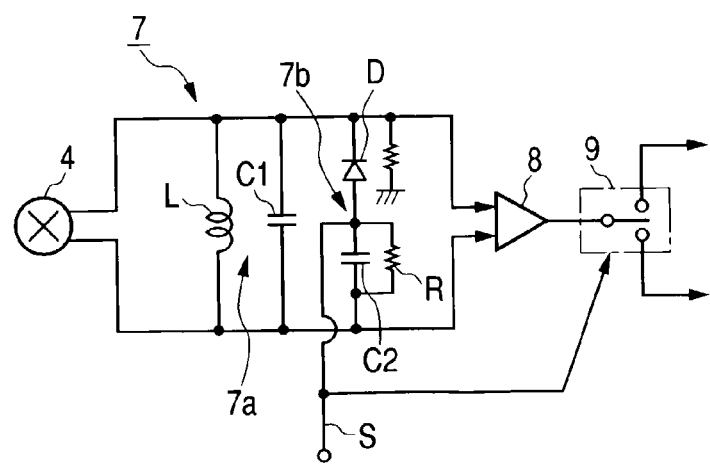
FIG. 2 is a circuit diagram of an intermediate frequency tuning circuit for use in the television tuner according to the invention.
Figure 3:
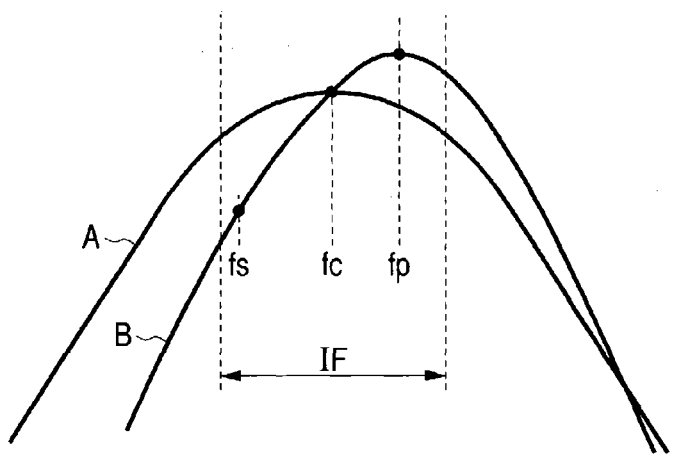
FIG. 3 is a diagram of tuning characteristics of the intermediate frequency tuning circuit in the television tuner according to the invention.
Figure 4:
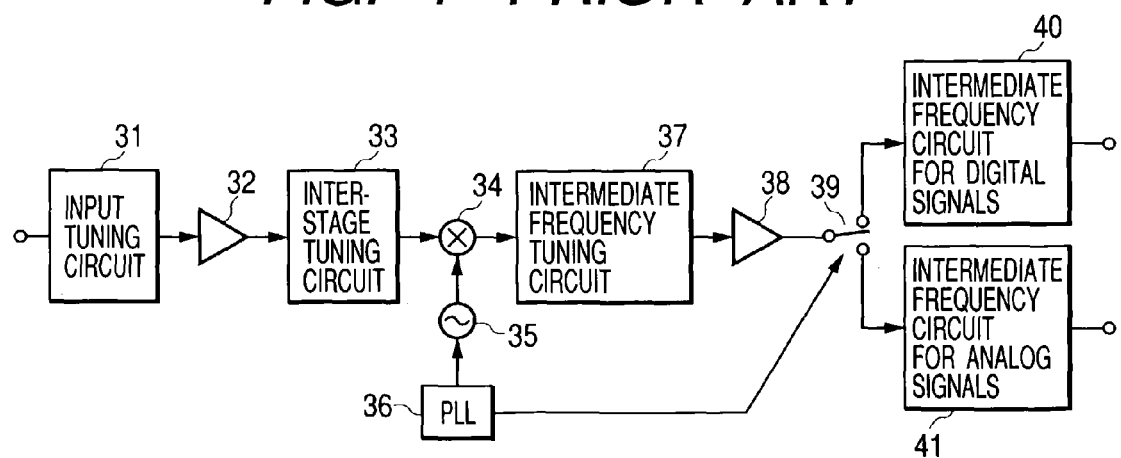
FIG. 4 is a circuit diagram showing the configuration of a television tuner according to the prior art.

A television tuner according to the present invention will be described with reference to FIG. 1 through FIG. 3. FIG. 1 shows a circuit configuration; FIG. 2, a specific configuration of an intermediate frequency tuning circuit; and FIG. 3, tuning characteristics of the intermediate frequency tuning circuit.

In FIG. 1, digital television signals and analog television signals (represented by rf therein) are entered into an input tuning circuit 1. The digital television signals are arrayed in other channels than those in which conventional analog television signals are arrayed, i.e. so-called vacant channels. Some sequences of television signals roughly selected by the input tuning circuit 1, after being amplified by a high frequency amplifier 2, are entered into an inter-stage tuning circuit 3. The tuning frequency of the inter-stage tuning circuit 3 and the tuning frequency of the input tuning circuit 1 are interlocked with each other. In this process, television signals on adjoining channels are further eliminated, and the selected sequence of television signals is entered into a mixer 4.

Local oscillation signals are supplied to the mixer 4 from an oscillator 5. Data Da for channel selection is entered into a PLL circuit 6 for controlling the oscillation frequency of the oscillator 5 and the tuning frequencies of the input tuning circuit 1 and the inter-stage tuning circuit 3 with a control voltage Vt. Therefore, either digital television signals or analog television signals are entered into the mixer 4. To the PLL circuit 6 is added a switching circuit for supplying a switching signal S for distinguishing between specific channels, for instance, a channel for digital television signals and a channel for analog television signals. For example, when digital television signals are entered into the mixer 4, the level becomes high or, when analog television signals, the level becomes low.

In the mixer 4, the entered television signals undergo frequency conversion into an intermediate frequency band IF (41 MHz to 47 MHz according to the U.S. specification). Therefore the converted signals (intermediate frequency signals represented by if in the drawing) include those deriving from digital television signals and those deriving from analog television signals. The intermediate frequency signals are entered into an intermediate frequency amplifier 8 via an intermediate frequency tuning circuit 7. Incidentally, the mixer 4, the intermediate frequency tuning circuit 7 and the intermediate frequency amplifier 8 are configured of balanced circuits.

The intermediate frequency tuning circuit 7 is configured to allow the tuning frequency to be switched within the intermediate frequency band IF by a switching signal supplied from the PLL circuit 6. Thus, when digital television signals are entered into the mixer 4, the intermediate frequency tuning circuit 7 is tuned to a first frequency fc, which is substantially the center of the intermediate frequency band (44 MHz according to the U.S. specification), or when analog television signals are entered, it is tuned to a second frequency (e.g. the video intermediate frequency fp (45.75 MHz according to the U.S. specification)).

FIG. 2 shows a specific configuration of the intermediate frequency tuning circuit 7. A parallel tuning circuit 7a configured of a capacitance element C1 and an inductance element L is tuned to the second frequency. To this parallel tuning circuit 7a are connected in parallel a series circuit 7b including a switch diode D and a capacitance element C2, and to the capacitance element C2 is connected in parallel a resistor R. The cathode of the switch diode D is grounded by a resistor, and to its cathode is entered a switching signal from the PLL circuit 6. Therefore, as the switching signal takes on a high level when digital television signals are entered into the mixer 4, the switch diode D is turned on, and the capacitance elements C1 and C2 are added together. The capacitance of the capacitance element C2 is so set in advance that the tuning frequency of the intermediate frequency tuning circuit 7 then be the aforementioned first frequency (44 MHz). Or when it is tuned to the first frequency, as the resistor R is connected, Q drops and the level deviation within the intermediate frequency band becomes even smaller. Therefore, the tuning characteristics of the intermediate frequency tuning circuit 7 then will be like A in FIG. 3.

On the other hand, as the switching signal takes on a low level when analog television signals are entered into the mixer 4, the switch diode D is turned off, and the capacitance element C2 and the resistor R are disconnected from the parallel tuning circuit 7a. Therefore, the tuning frequency of the intermediate frequency tuning circuit 7 becomes the aforementioned second frequency (45.75 MHz) and Q also becomes greater. Therefore, the tuning characteristics of the intermediate frequency tuning circuit 7 then will be like B in FIG. 3, and the audio intermediate frequency fs will become 4 to 5 dB lower than the video intermediate frequency fp.

On the output side of the intermediate frequency amplifying circuit 8 are provided switching means 9 and two intermediate frequency circuits 10 and 11. One of the intermediate frequency circuits, the intermediate frequency circuit 10 for digital signals, processes digital television signals, while the other intermediate frequency circuit 11 for analog signals processes analog television signals. The switching means 9 connects the intermediate frequency amplifier 8 to the intermediate frequency circuit 10 for digital signals or the intermediate frequency circuit 11 for analog signals in response to the switching signal supplied from the PLL circuit 6.

Therefore, if digital television signals are entered into the mixer 4, the intermediate frequency signals deriving from them will be entered into the intermediate frequency circuit 10 for digital signals, or if analog television signals are entered, the intermediate frequency signals deriving from them will be entered into the intermediate frequency circuit 11 for analog signals.

The television tuner according to the present invention, it is provided with a mixer for subjecting entered television signals to frequency conversion into an intermediate frequency band so configured as to enable the tuning frequency to be switched within the intermediate frequency band and an intermediate frequency tuning circuit at the stage immediately following the mixer, and the intermediate frequency tuning circuit is tuned to a first frequency substantially at the center of the intermediate frequency band when digital television signals are entered into the mixer or tuned to a second frequency higher than the first frequency when analog television signals are entered into the mixer, therefore the intermediate frequency band is switched between a substantially flat characteristic and a characteristic of a slightly higher video intermediate frequency than the audio intermediate frequency. Therefore, the characteristic of the intermediate frequency band can be switched in two ways, one suitable for the reception of digital television signals and the other suitable for the reception of analog television signals.

Further, Q of the intermediate frequency tuning circuit is lowered when digital television signals are entered into the mixer, and Q is raised and the tuning frequency is tuned substantially to the video intermediate frequency in the intermediate frequency band when analog television signals are entered, therefore the intermediate frequency band is made even flatter in characteristic when digital television signals are received, or the audio intermediate frequency is made surely lower than the video intermediate frequency when analog television signals are received.

Further, the intermediate frequency tuning circuit has a parallel tuning circuit tuned substantially to the video intermediate frequency, a series circuit including a switch diode and capacitance elements, and a resistor connected to the capacitance elements in parallel, the series circuit is connected to the parallel tuning circuit in parallel, and the switch diode is turned on when digital television signals are entered into the mixer or the switch diode is turned off when analog television signals are entered into the mixer, therefore Q of the intermediate frequency band and the tuning frequency can be switched without fail.

Further, the television tuner has the switching means provided at a stage following the intermediate frequency tuning circuit and the intermediate frequency circuit for digital signals and the intermediate frequency circuit for analog signals provided in parallel at a stage following the switching means, and digital television signals having undergone frequency conversion into the intermediate frequency band by the switching means are entered into the intermediate frequency circuit for digital signals or analog television signals having undergone frequency conversion into the intermediate frequency band are entered into the intermediate frequency circuit for analog signals, therefore both digital television signals and analog television signals can be entered into the intermediate frequency circuits respectively intended for them.

Further, there are applied, to the switch diode and the switching means, switching signals for distinguishing whether television signals entered into the mixer are digital television signals or analog television signals, therefore the type of television signals to be received and the intermediate frequency circuit to be used can be selected in an interlocked way.

What is claimed is:

1. A television tuner provided with a mixer for subjecting one of entered digital television signals and analog television signals to frequency conversion into an intermediate frequency band and an intermediate frequency tuning circuit so configured as to enable a tuning frequency to be switched within the intermediate frequency band and arranged at a stage immediately following the mixer, wherein the intermediate frequency tuning circuit is tuned to a first frequency substantially at a center of the intermediate frequency band when the digital television signals are entered into the mixer and tuned to a second frequency higher than the first frequency when the analog television signals are entered into the mixer, wherein Q of the intermediate frequency tuning circuit is lowered when the digital television signals are entered into the mixer, and wherein the Q is raised and the tuning frequency is tuned substantially to a video intermediate frequency in the intermediate frequency band when the analog television signals are entered into the mixer, the intermediate frequency tuning circuit has a parallel tuning circuit to be substantially tuned to the video intermediate frequency, a series circuit including a switch diode and capacitance elements, and a resistor connected in parallel to the capacitance elements, the series circuit is connected to the parallel tuning circuit in parallel, and the switch diode is turned on when the digital television signals are entered into the one of the mixer and the switch diode is turned off when the analog television signals are entered into the mixer.

2. The television tuner according to claim 1 wherein the television tuner has switching means provided at a stage following the intermediate frequency tuning circuit and an intermediate frequency circuit for digital signals and an intermediate frequency circuit for analog signals provided in parallel at a stage following the switching means, and wherein the digital television signals having undergone frequency conversion into the intermediate frequency band by the switching means are entered into the intermediate frequency circuit for digital signals and the analog television signals having undergone frequency conversion into the intermediate frequency band are entered into the intermediate frequency circuit for analog signals.

3. The television tuner according to claim 2, wherein switching signals to distinguish whether television signals entered into the mixer are the digital television signals or the analog television signals are applied to the switch diode and the switching means.

* * * * *

UNITED STATES PATENT AND TRADEMARK OFFICE
CERTIFICATE OF CORRECTION

| | |
|---|---|
| PATENT NO. | : 7,123,309 B2 |
| APPLICATION NO. | : 10/614544 |
| DATED | : October 17, 2006 |
| INVENTOR(S) | : Mitsumasa Yoda |

Page 1 of 1

It is certified that error appears in the above-identified patent and that said Letters Patent is hereby corrected as shown below:

On the Title Page, Item 56

Column 2, line 4, after "6,678,013" delete "B1" and substitute --B2-- in its place.

Column 2, line 5, after "6,721,017" delete "B1" and substitute --B2-- in its place.

Column 2, line 6, after "6,876,402" delete "B1" and substitute --B2-- in its place.

Column 2, line 7, after "6,917,390" delete "B1" and substitute --B2-- in its place.

Signed and Sealed this

Seventeenth Day of April, 2007

JON W. DUDAS
*Director of the United States Patent and Trademark Office*